United States Patent
Lee

(10) Patent No.: US 7,485,555 B2
(45) Date of Patent: Feb. 3, 2009

(54) METHODS FOR FORMING A P-TYPE POLYSILICON LAYER IN A SEMICONDUCTOR DEVICE

(75) Inventor: Jae-Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 314 days.

(21) Appl. No.: 11/291,948

(22) Filed: Dec. 1, 2005

(65) Prior Publication Data

US 2006/0141752 A1   Jun. 29, 2006

(30) Foreign Application Priority Data

Dec. 23, 2004   (KR) .................... 10-2004-0111043

(51) Int. Cl.
*H01L 21/22* (2006.01)
*H01L 21/38* (2006.01)

(52) U.S. Cl. .................. 438/542; 438/558; 438/142; 257/327; 257/E29.241; 257/E21.106; 257/E21.134

(58) Field of Classification Search .............. 438/542, 438/558, 142, 511; 257/327, E29.241, E21.134; 117/88, 104, 105
See application file for complete search history.

(56) References Cited

U.S. PATENT DOCUMENTS

| 6,555,451 B1 * | 4/2003 | Kub et al. ............. 438/542 |
| 6,716,751 B2 * | 4/2004 | Todd .................... 438/680 |
| 6,746,934 B2 * | 6/2004 | Sandhu et al. ......... 438/428 |

* cited by examiner

*Primary Examiner*—Asok K Sarkar
*Assistant Examiner*—Julia Slutsker
(74) *Attorney, Agent, or Firm*—Andrew D. Fortney

(57) ABSTRACT

A P-type polysilicon layer having a stable and desired resistivity is formed by alternately depositing a plurality of silicon atom layers and a plurality of group IIIA element atom layers on a semiconductor substrate by atomic layer deposition, and thereafter forming a P-type polysilicon layer by thermally diffusing the plurality of group IIIA element atom layers into the plurality of silicon atom layers. The plurality of group IIIA element atom layers may comprise Al, Ga, In, and/or Tl.

20 Claims, 3 Drawing Sheets

METHODS FOR FORMING A P-TYPE POLYSILICON LAYER IN A SEMICONDUCTOR DEVICE

FIELD OF THE DISCLOSURE

The present disclosure relates generally to methods of manufacturing semiconductor devices, and, more particularly, to methods for forming a P-type polysilicon layer in a semiconductor device.

BACKGROUND

During a typical process of manufacturing a semiconductor device, a gate oxide layer 102 is formed on a semiconductor substrate 100. A doped polysilicon layer 104a used as a gate electrode is formed on the gate oxide layer 102 as shown in FIG. 1. A liner layer 106 and a spacer 108 are formed on the sidewalls of the doped polysilicon layer 104a. In addition, an LDD source/drain 114 having a lightly doped region 110 and a heavily doped region 112 is formed under the liner layer 106 and the spacer 108.

A P-type polysilicon layer is widely used for the gate electrode in a semiconductor device. The P-type polysilicon layer 104a is, as shown in FIG. 2, usually formed by a doping process using boron 116 with a mask pattern 109 having an opening exposing only the polysilicon layer 104. Alternatively, as shown in FIG. 3, the P-type polysilicon layer 104a may be formed by a doping process using boron 116 after forming an isolation layer 101, a gate oxide layer 102, and a polysilicon layer 104 on the semiconductor substrate 100.

The doping process using boron is performed by an in-situ process in a furnace, or by ion implantation of boron ions or $BF_3$ ions. In FIG. 1 to FIG. 3, the same reference numerals indicate the same members.

The boron used for forming a P-type polysilicon layer is volatile, and thus, when the thickness of the P-type polysilicon layer is reduced, the concentration of the boron cannot be precisely obtained as desired.

Figure 1:
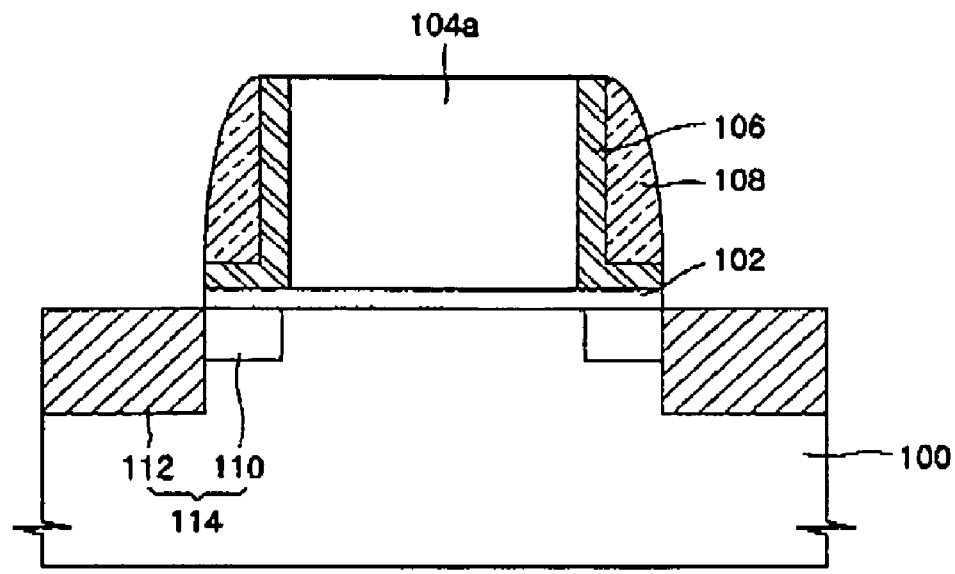
FIG. 1 is a cross-sectional view of a typical prior art semiconductor device.
Figure 2:
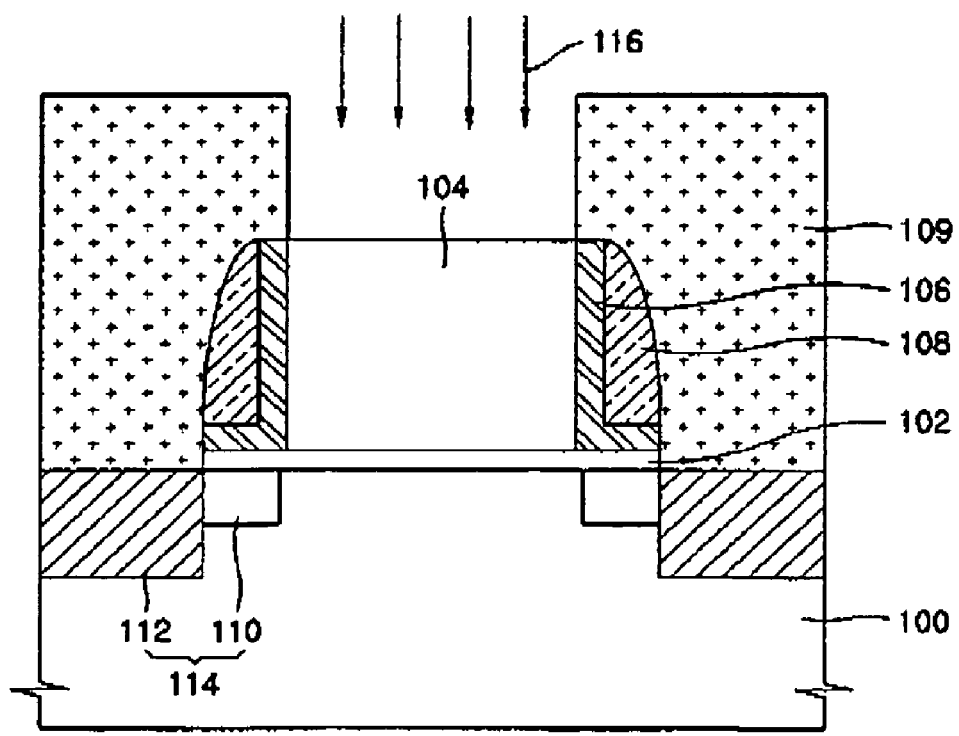
FIG. 2 and FIG. 3 are cross-sectional views showing a method for forming a P-type polysilicon layer used for a gate electrode in a semiconductor device such as that shown in FIG. 1.
Figure 3:
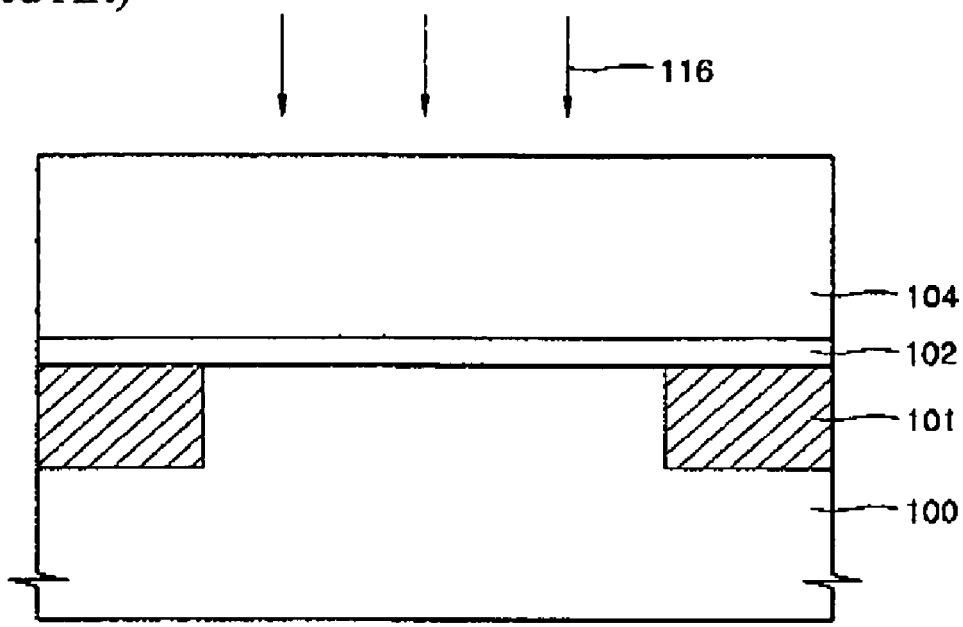

To clarify multiple layers and regions, the thickness of the layers are enlarged in the drawings. Wherever possible, the same reference numbers will be used throughout the drawing(s) and accompanying written description to refer to the same or like parts. As used in this patent, stating that any part (e.g., a layer, film, area, or plate) is in any way positioned on (e.g., positioned on, located on, disposed on, or formed on, etc.) another part, means that the referenced part is either in contact with the other part, or that the referenced part is above the other part with one or more intermediate part(s) located therebetween. Stating that any part is in contact with another part means that there is no intermediate part between the two parts.

DETAILED DESCRIPTION

Figure 4:
FIG. 4 to FIG. 6 are cross-sectional views illustrating an example method for forming a P-type polysilicon layer performed in accordance with the teachings of the present invention.
Figure 5:
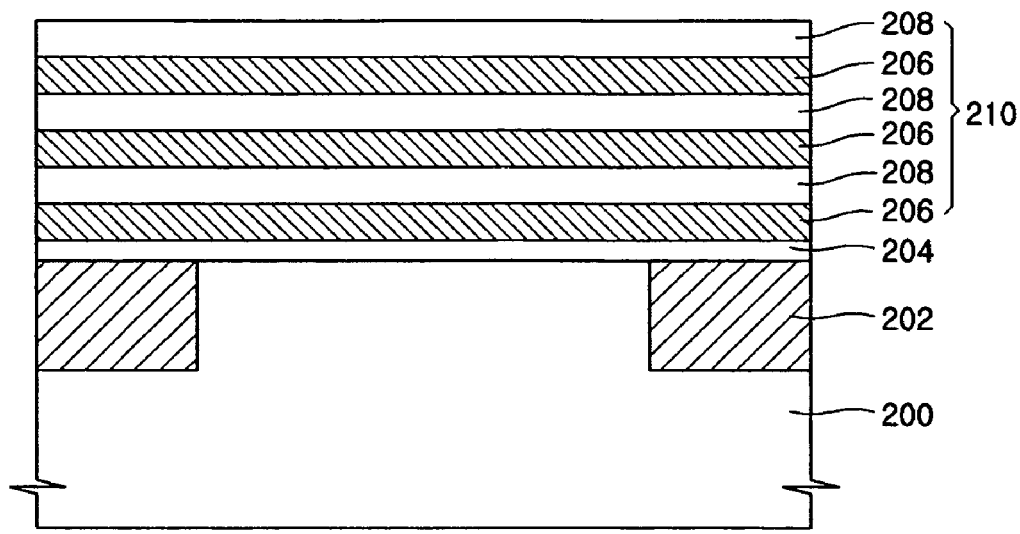
Figure 6:
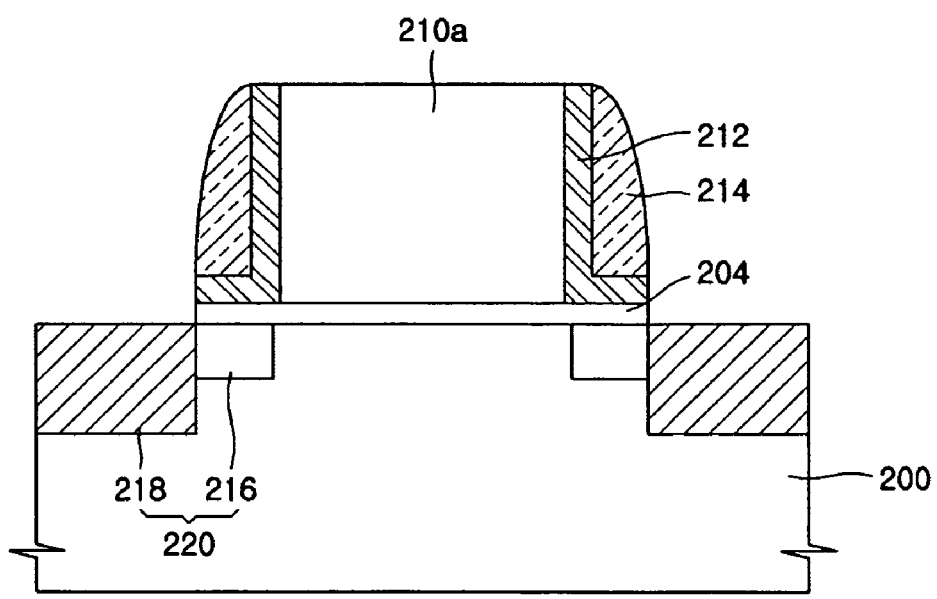

FIG. 4 to FIG. 6 are cross-sectional views illustrating an example method for forming a P-type polysilicon layer performed in accordance with the teachings of the present invention.

Referring to FIG. 4, in the illustrated example, an isolation layer 202 is formed on a semiconductor substrate 200, such as a silicon substrate. Subsequently, a gate insulating layer 204 is formed on the semiconductor substrate 200. The gate insulating layer 204 may be, for example, an oxide layer.

Referring to FIG. 5, a gate stack 210 is formed by alternately depositing a plurality of silicon atom layers 206 and a plurality of group IIIA element atom layers 208 on the gate insulating layer 204 by atomic layer deposition (ALD).

In the illustrated example, the plurality of silicon atom layers are respectively deposited to a thickness of about 5-100 Å, and the plurality of group IIIA element atom layers are respectively deposited to a thickness of about 5-50 Å. The plurality of group IIIA element atom layers may comprise Al, Ga, In, or Tl. The thicknesses of the plurality of silicon atom layers 206 and the plurality of group IIIA element atom layers 208 depend on a desired dopant concentration.

Subsequently, the plurality of group IIIA element atom layers 208 in the gate stack 210 are diffused into the plurality of silicon atom layers 206 by a heat treatment process, and thus a P-type polysilicon layer 210a (see FIG. 6) is formed.

FIG. 6 is a cross-sectional view of a semiconductor device having a P-type polysilicon layer 210a constructed in accordance with the teachings of the present invention. In the example of FIG. 6, reference numerals 212 and 214 respectively denote a liner layer and a spacer layer formed on the sidewalls of the P-type polysilicon layer 210a. Reference numeral 216 denotes the first impurity region, and reference numeral 218 denotes the second impurity region. Reference numeral 220 denotes a source/drain region of an LDD structure.

As described above, a P-type polysilicon layer having a stable and desired resistivity can be formed by atomic layer deposition and heat treatment of alternating silicon atom layers and group IIIA element atom layers.

From the foregoing, persons of ordinary skill in the art will readily appreciate that example methods of manufacturing a semiconductor device have been provided which obtain precise resistivity of a P-type polysilicon layer even if the P-type polysilicon layer is thin.

An example method of manufacturing a semiconductor device includes alternately depositing a plurality of silicon atom layers and a plurality of group IIIA element atom layers on a semiconductor substrate by atomic layer deposition, and forming a P-type polysilicon layer by thermally diffusing the plurality of group IIIA element atom layers into the plurality of silicon atom layers. The plurality of silicon atom layers are respectively deposited to a thickness of about 5-100 Å, and the plurality of group IIIA element atom layers are respectively deposited to a thickness of about 5-50 Å. The plurality of group IIIA element atom layers may comprise Al, Ga, In, or Tl.

It is noted that this patent claims priority from Korean Patent Application Ser. No. 10-2004-0111043, which was filed on Dec. 23, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for forming a P-type polysilicon layer in a semiconductor device, comprising:
    forming a first silicon atom layer on a semiconductor substrate by atomic layer deposition;
    forming a first group IIIA element atom layer on the first silicon atom layer by atomic layer deposition:
    forming a gate stack by repeatedly depositing second silicon atom layers and second IIIA element atom layers on the semiconductor substrate by atomic layer deposition several times, wherein the silicon atom layers and the group IIIA element atom layers in the gate stack are alternately deposited; and
    forming a P-type polysilicon layer by thermally diffusing the plurality of group IIIA element atom layers in the gate stack into the plurality of silicon atom layers.

2. A method as defined in claim 1, wherein the first and second silicon atom layers are respectively deposited to a thickness of about 5-100Å.

3. A method as defined in claim 1, wherein the first and second group IIA element atom layers are respectively deposited to a thickness of about 5-50Å.

4. A method as defined in claim 1, wherein the first and second group IIIA element atom layers comprise at least one of Al, Ga, In, or Tl.

5. A method as defined in claim 1, wherein the first and second silicon atom layers are respectively deposited to a thickness of about 5-100Å and the first and second group IIIA clement atom layers arc respectively deposited to a thickness of about 5-50Å, and the first and second group IIIA element atom layers comprise at least one of Al, Ga, In, or Tl.

6. A method as defined in claim 1, further comprising forming a gate insulating layer on the substrate before forming the gate stack.

7. A method for forming a P-type polysilicon layer in a semiconductor device, comprising:
    depositing a silicon atom layer on a semiconductor substrate by atomic layer deposition;
    depositing a group IIIA element atom layer on the silicon atom layer by atomic layer deposition:
    repeating the silicon atom layer and group IIIA element atom layer depositing steps to form a gate stack: and
    forming a P-type polysilicon layer by thermally diffusing the group IIIA element atom layers in the gate stack into the silicon atom layers.

8. A method as defined in claim 7, wherein the silicon atom layers are respectively deposited to a thickness of about 5-100Å.

9. A method as defined in claim 7, wherein the group IIIA element atom layers are respectively deposited to a thickness of about 5-50Å.

10. A method as defined in claim 7, wherein the group IIIA element atom layers comprise at least one of Al, Ga, In, or TI.

11. A method as defined in claim 7, wherein the method comprises depositing three silicon atom layers and three group IIIA element atom layers.

12. A method as defined in claim 7, wherein the semiconductor substrate comprises silicon.

13. A method as defined in claim 10, further comprising forming a gate insulating layer on the substrate before depositing the silicon atom layer and the group IIIA element atom layer.

14. A method as defined in claim 13, wherein the gate insulating layer comprises an oxide layer.

15. A method as defined in claim 13, further comprising forming a liner layer on sidewalls of the P-type polysilicon layer and the gate insulating layer.

16. A method as defined in claim 15, further comprising forming a spacer layer on the liner layer.

17. A method as defined in claim 15, further comprising forming first and second impurity regions in the substrate.

18. A method as defined in claim 16, further comprising forming source and drain regions in the substrate.

19. A method as defined in claim 1, wherein the method comprises depositing three silicon atom layers and three group IIIA element atom layers.

20. A method as defined in claim 1, wherein the semiconductor substrate comprises silicon.

* * * * *